(12) United States Patent
Nii

(10) Patent No.: US 6,791,200 B2
(45) Date of Patent: Sep. 14, 2004

(54) SEMICONDUCTOR MEMORY DEVICE

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/322,626

(22) Filed: Dec. 19, 2002

(65) Prior Publication Data

US 2003/0230815 A1 Dec. 18, 2003

(30) Foreign Application Priority Data

Jun. 17, 2002 (JP) .......................................... 2002-175682

(51) Int. Cl.⁷ .............................................. H01L 27/11
(52) U.S. Cl. ......................... 257/903; 257/903; 257/905
(58) Field of Search ................................ 257/903, 902, 257/69, 369, 393, 368, 314, 315

(56) References Cited

U.S. PATENT DOCUMENTS 5,100,817 A * 3/1992 Cederbaum et al. ........ 438/152
6,300,229 B1 * 10/2001 Tanaka et al. .............. 438/584
6,469,400 B2 * 10/2002 Kumagai et al. ........... 257/368

FOREIGN PATENT DOCUMENTS

| JP | 10-178110 | 6/1998 |
| JP | P2001-28401 A | 1/2001 |

* cited by examiner

Primary Examiner—David Nelms
Assistant Examiner—Thinh T Nguyen
(74) Attorney, Agent, or Firm—McDermott Will & Emery LLP

(57) ABSTRACT

An SRAM includes a plurality of memory cells which are arranged in an extension direction of bit lines, each of which has a long edge and a short edge, an extension direction of the short edge being equal to the extension direction of the bit lines. A distance between polysilicon wirings which are formed in one of the memory cells and which become gates of NMOS transistors arranged in the extension direction of the bit lines, respectively, differs from a distance between the polysilicon wiring and the polysilicon wiring which becomes a gate of an NMOS transistor formed in the other memory cell.

6 Claims, 9 Drawing Sheets

SEMICONDUCTOR MEMORY DEVICE

BACKGROUND OF THE INVENTION

1. Field of the Invention

The present invention relates to a semiconductor memory device, and more particularly to a memory cell structure of a full CMOS static semiconductor memory device (hereinafter, referred to as "SRAM (Static Random Access Memory)").

2. Description of the Background Art

FIG. 8 shows a conventional layout configuration of a full CMOS SRAM memory cell which consists of six MOS (Metal Oxide Semiconductor) transistors. An SRAM memory cell of this type is disclosed by, for example, Japanese Patent Laying-Open Nos. 10-178110 and 2001-28401.

As shown in FIG. 8, a memory cell 1 includes six MOS transistors. Specifically, memory cell 1 includes NMOS transistors N1, N2, N3 and N4 which are formed on P wells on both sides of an N well and PMOS transistors P1 and P2 which are formed on the central N well.

NMOS transistor N1 is formed in a crossing portion between an impurity diffused region 2a and a polysilicon wiring 3b, NMOS transistor N2 is formed in a crossing portion between an impurity diffused region 2d and a polysilicon wiring 3c, NMOS transistor N3 is formed in a crossing portion between impurity diffused region 2a and a polysilicon wiring 3a, and NMOS transistor N4 is formed in a crossing portion between impurity diffused region 2d and a polysilicon wiring 3d. PMOS transistor P1 is formed in a crossing portion between an impurity diffused region 2b and polysilicon wiring 3b, and PMOS transistor P2 is formed in a crossing portion between an impurity diffused region 2c and polysilicon wiring 3c.

PMOS transistors P1 and P2 are load transistors, NMOS transistors N3 and N4 are access transistors, and NMOS transistors N1 and N2 are driver transistors. Impurity diffused regions 2a to 2d are connected to upper layer wirings through contact holes 4a to 4l.

In the layout configuration shown in FIG. 8, word lines are arranged in a lateral direction. Bit lines are arranged in a longitudinal direction. FIG. 9 shows a layout configuration of memory cells 1 of two bits adjacent each other in the extension direction of bit lines.

Lower memory cell 1 shown in FIG. 9 is obtained by arranging upper memory cell 1 to be inverted about the boundary line between upper and lower memory cells 1. As shown in FIG. 9, a distance D1 between polysilicon wirings 3a and 3b is equal to a distance D2 between polysilicon wiring 3b and polysilicon wiring 3b of adjacent memory cell 1.

Meanwhile, to highly integrate memory cells 1, it is rather efficient to shorten the short edge of memory cell 1 rather than to shorten the long edge thereof. If memory cell 1 shown in FIG. 8 is formed by using process technique of a gate length of, for example, 0.18 μm, then the length of the short edge of memory cell 1 is 1.4 μm and that of the long edge thereof is 3.6 μm, for example. If so, the area of memory cell 1 is 5.04 μm².

Now, if it is assumed that memory cell 1 can be shortened by 0.1 μm in a long edge direction, the area of the shortened memory cell is 1.4 μm×3.5 μm=4.9 μm² and can be reduced by approximately 3%. On the other hand, if it is assumed that memory cell can be shortened by 0.1 μm in a short edge direction, the area of the shortened memory cell is 1.3 μm×3.6 μm=4.68 μm² and can be reduced by approximately 7%.

If memory cell 1 is reduced by the same length, it is more effective to do so in the short edge direction. To shorten memory cell 1 in the short edge direction, the distance D between polysilicon wirings 3a or 3b which serves as a gate and contact hole 4b, 4c or 4d may simply be shortened.

However, if distance D is shortened, it is disadvantageously impossible to secure a margin for a mask deviation or the like which may cause during the formation of polysilicon wirings 3a and 3b and contact holes 4b, 4c and 4d.

SUMMARY OF THE INVENTION

The present invention has been achieved to solve the above-described problem. It is an object of the present invention to provide a semiconductor memory device capable of efficiently reducing a memory cell area while securing a mask margin for a mask deviation or the like during the formation of a polysilicon wiring, a contact hole or the like.

A semiconductor memory device according to the present invention, includes: a word line; a bit line extending in a direction orthogonal to an extension direction of the word line; first and second memory cells aligned in the extension direction of the bit line; first and second gates of first and second MOS transistors, respectively, formed in the first memory cell, extending in the extension direction of the word line and arranged to be away from each other in the extension direction of the bit line; and third and fourth gates of third and fourth MOS transistors, respectively, formed in the second memory cell, extending in the extension direction of the word line, and arranged to be away from each other in the extension direction of the bit line. The second and third MOS transistors are located in the vicinity of a boundary between the first and second memory cells, and a distance between the first and second gates differs from a distance between the second and third gates.

The distance between the gates in the extension direction of the bit line is normally set at a minimum dimension in light of a margin during manufacturing. Due to this, to provide different gate distances in the extension direction of the bit line, it is necessary to locally set the gate distances shorter than the minimum dimension. By locally setting the gate distances shorter, it is possible to reduce the length of the shorter side of the memory cell. It is thereby possible to efficiently reduce a memory cell area.

The distance between the first and second gates may be set shorter than the distance between the second and third gates, and the distance between the second and third gates may be set shorter than the distance between the first and second gates.

The above-described semiconductor memory device includes: an impurity diffused region extending in the extension direction of the bit line, and having the first, second, third and fourth gates extending thereon; a first contact section formed on the impurity diffused region located between the first and second gates; and a second contact section formed on the impurity diffused region located between the second and third gates. In this case, a size of the first contact section is set smaller than a size of the second contact section. The first contact section is preferably a contact section in which even the increase of contact resistance does not influence a read rate, e.g., a contact section which is formed on the impurity diffused region which become a storage node section.

Further, the above-described semiconductor memory device may include: an impurity diffused region extending in the extension direction of the bit line, having first, second, third and fourth gates extending thereon, and having a protrusion section (a bent section or a branched section) protruding in the extension direction of the word line between the second and third gates; a first contact section formed on the impurity diffused region located between the first and second gates; and a second contact section provided on the protrusion section of the impurity diffused region, and formed at a position shifted from a region between the second and third gates in the extension direction of the word line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
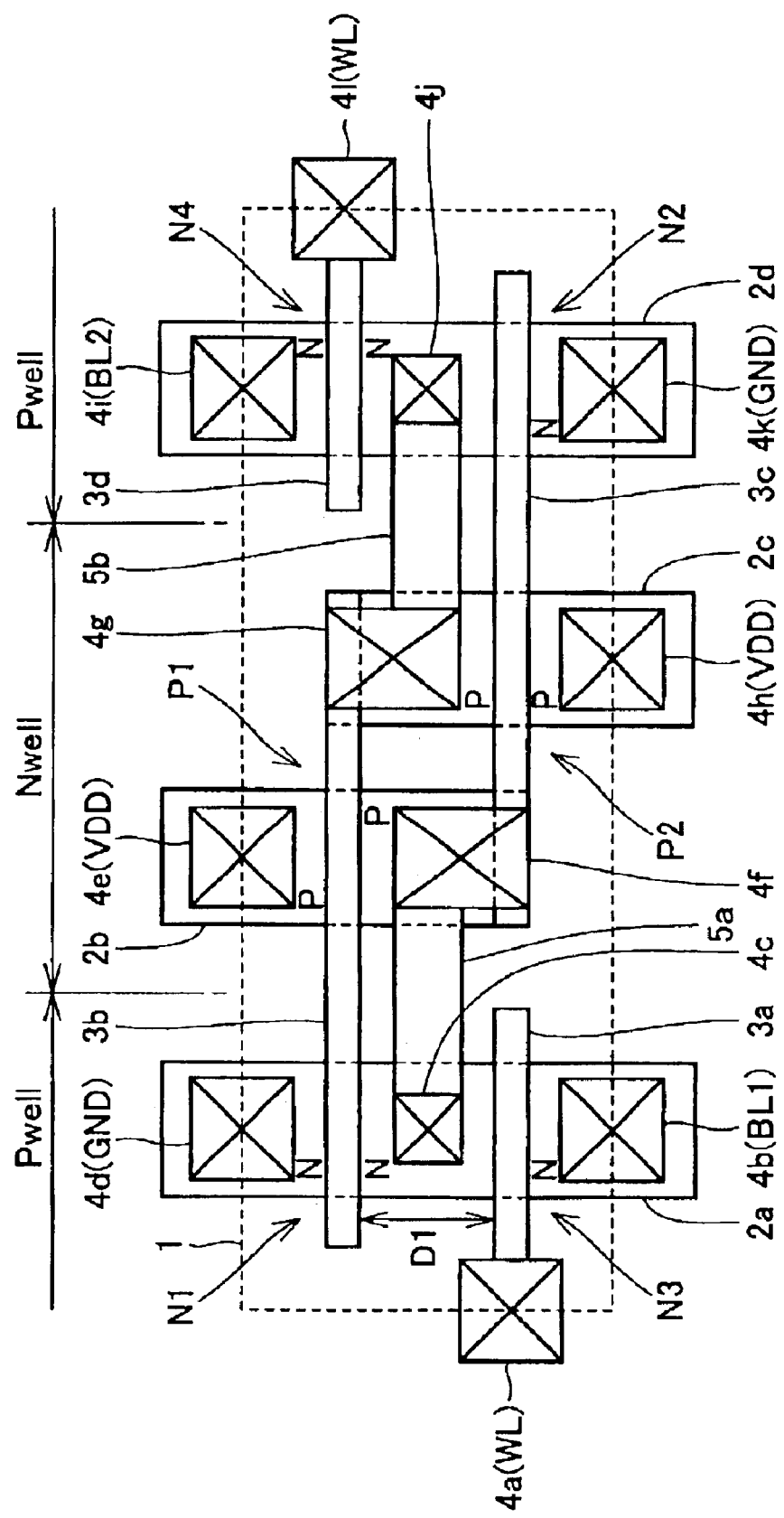
FIG. 1 shows a layout configuration of an SRAM memory cell according to a first embodiment of the present invention.
Figure 2:
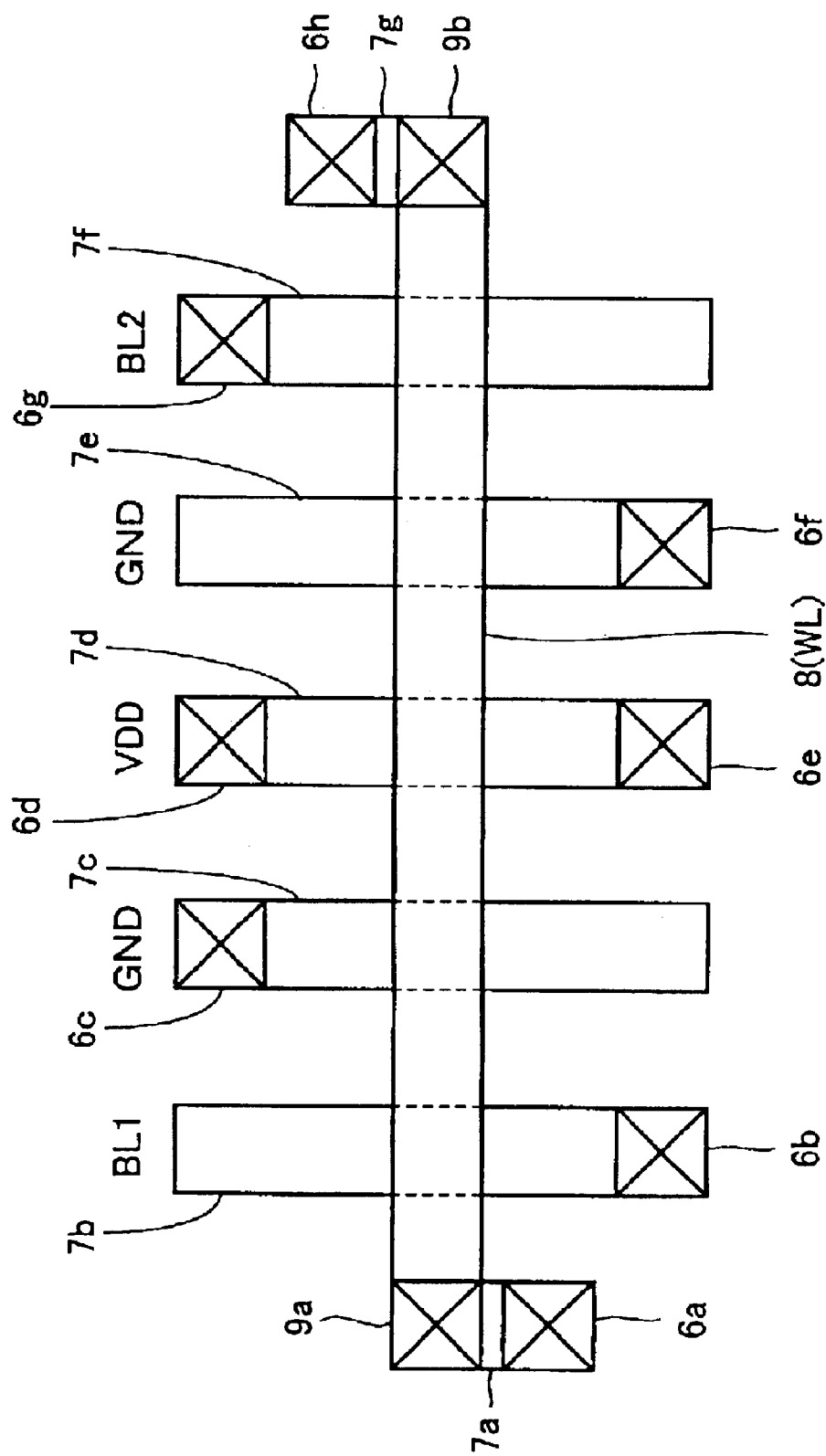
FIG. 2 shows a layout configuration of upper layer metal wirings of the memory cell shown in FIG. 1.

Hereinafter, embodiments of the present invention will be described with reference to FIGS. 1 to 7.
First Embodiment FIGS. 1 and 2 are plan views of a memory cell 1 of a full CMOS SRAM (static semiconductor memory device) according to a first embodiment of the present invention. An equivalent circuit diagram of memory cell 1 is shown in FIG. 7. It is noted that FIG. 1 shows a layout of memory cell 1 up to predetermined first metal wirings and that FIG. 2 shows a layout of second and third metal wirings.

The configuration of SRAM memory cell 1 will be briefly described first with reference to FIG. 7. Memory cell 1 has a full CMOS cell structure in which first and second inverters and two access NMOS transistors N3 and N4 are provided.

As shown in FIG. 7, the first inverter includes a first driver MOS transistor N1 and a first load PMOS transistor P1, and the second inverter includes a second driver MOS transistor N2 and a second load PMOS transistor P2.

First and second inverters constitute a flip-flop in which the inputs of the inverters are connected to each other and the outputs thereof are connected to each other. The source of first access NMOS transistor N3 is connected to a first storage node Na of the flip-flop and the source of second access NMOS transistor N4 is connected to a second storage node Nb of the flip-flop.

Storage node Na is connected to a bit line BL1 through first access NMOS transistor N3 and storage node Nb is connected to a bit line BL2 through second access NMOS transistor N4. Further, the gates of first and second access NMOS transistors N3 and N4 are connected to a word line WL and the sources of first and second load PMOS transistors P1 and P2 are connected to a power supply line VDD.

The layout of full CMOS SRAM memory cell 1 described above will next be described. As shown in FIG. 1, P well regions are provided on both sides of an N well region. N-type impurities such as phosphorus are selectively injected into the P well regions to form impurity diffused regions 2a and 2d, respectively, and P-type impurities such as boron are selectively injected into the N well region to form impurity diffused regions 2b and 2c. In this specification, impurity diffused regions 2a to 2d are regions each including regions which become the source/drain of a transistor and including a region (substrate portion) which is located between the source and the drain regions and which is opposite in conductive type to that of the source/drain regions.

Impurity diffused regions 2a and 2d, and impurity diffused regions 2b and 2c are all linear regions and extend in the same direction (the extension direction of the P well regions and the N well region). With this configuration, it is possible to decrease the unevenness of the widths and formation positions of the P and N well regions.

Memory cell 1 in this embodiment consists of six MOS transistors. Specifically, memory cell 1 consists of first and second driver NMOS transistors N1 and N2, first and second access NMOS transistors N3 and N4 and first and second load PMOS transistors P1 and P2.

First and second access NMOS transistors N3 and N4 and first and second driver NMOS transistors N1 and N2 are formed on the P well regions on the both side of the N well region, respectively. First and second load PMOS transistors P1 and P2 are formed on the central N well region.

First access NMOS transistor N3 is formed in the crossing portion between impurity diffused region 2a including regions which become a source and a drain, and polysilicon wiring 3a, and second access NMOS transistor N4 is formed in the crossing portion between impurity diffused region 2d including regions which become a source and a drain, and polysilicon wiring 3d.

First driver NMOS transistor N1 is formed in the crossing portion between impurity diffused region 2a including regions which become a source and a drain, and polysilicon wiring 3b, and second driver NMOS transistor N2 is formed in the crossing portion between impurity diffused region 2d including the regions which become the source and the drain, and polysilicon wiring 3c.

First load PMOS transistor P1 is formed in the crossing portion between impurity diffused region 2b including regions which become a source and a drain, and polysilicon wiring 3b, and second load PMOS transistor P2 is formed in the crossing portion between impurity diffused region 2c including the regions which become the source and the drain, and polysilicon wiring 3c.

Polysilicon wirings 3a to 3d become the gates of each of MOS transistors and, as shown in FIG. 1, extend in the same direction. Namely, polysilicon wirings 3a to 3d extend in the direction (lateral direction in FIG. 1) which is perpendicular to the direction (longitudinal direction in FIG. 1) in which the P well regions and the N well region extend, and in which the P well regions and the N well region are aligned.

A first interlayer insulating film, not shown, is formed to cover impurity diffused regions 2a and 2d, impurity diffused regions 2b and 2c and polysilicon wirings 3a to 3d, and contact holes (contact sections) 4a to 4l, which reach impurity diffused regions 2a and 2d, impurity diffused regions 2b and 2c and polysilicon wirings 3a and 3d, are formed in the first interlayer insulating film. A conductive layer for connection to upper layer wirings is embedded in contact holes 4a to 4l.

It is noted that contact holes 4a and 4l are gate contacts which reach gates, contact holes 4f and 4g are shared contacts which reach the impurity diffused regions and the polysilicon wirings, and other contact holes 4b, 4c, 4d, 4e, 4h, 4i, 4j and 4k are diffused contacts which reach the impurity diffused regions, respectively.

In FIG. 1, the N-type impurity diffused region which becomes the drain of first driver NMOS transistor N1 and the N-type impurity diffused region which becomes the drain of first access NMOS transistor N3 are shared between transistors N1 and N2. The drain of first driver NMOS transistor N1 and that of first access NMOS transistor N3 are connected to the drain of first load transistor P1 through contact hole 4c formed on the N-type impurity region, a first metal wiring 5a and contact hole (shared contact) 4f. This terminal corresponds to storage node Na in the equivalent circuit diagram shown in FIG. 7.

Likewise, the N-type impurity diffused region which is the drain of second driver NMOS transistor N2 and the N-type impurity diffused region which is the drain of second access NMOS transistor N4 are connected to the drain of second load transistor P2 through contact hole 4j, a first metal wiring 5b and contact hole (shared contact) 4g. This terminal corresponds to storage node Nb in the equivalent circuit diagram shown in FIG. 7.

Referring next to FIG. 2, second metal wirings 7a to 7g are formed on first metal wirings 5a and 5b through a second interlayer insulating film which is not shown in FIG. 2. Second metal wirings 7a and 7g are connected to first metal wirings, not shown in FIG. 2, through first via holes 6a and 6h formed in the second interlayer insulating film, respectively. Second metal wirings 7b and 7f are connected to the first metal wirings, not shown in FIG. 2, through first via holes 6b and 6g and become bit lines BL1 and BL2, respectively. Second metal wirings 7c and 7e are connected to the first metal wirings, not shown in FIG. 2, through first via holes 6c and 6f and become ground lines (GND lines), respectively. Second metal wiring 7d is connected to the first metal wirings, not shown in FIG. 2, through first via holes 6d and 6e and becomes a power supply line (VDD line).

Partial regions of impurity diffused regions 2a and 2d in the P well regions become source terminals of driver NMOS transistors N1 and N2, respectively, and applied with a GND potential through contact holes (diffusion contacts) 4d and 4k, the first metal wirings and first via holes 6c and 6f, respectively.

Partial regions of impurity diffused regions 2a and 2d in the P well regions become source terminals of access NMOS transistors N3 and N4, respectively, and connected to bit lines BL1 and BL2 through contact holes (diffusion contacts) 4b and 4i, the first metal wirings and first via holes 6b and 6g, respectively.

Partial regions of impurity diffused regions 2b and 2c in the N well region become source terminals of load PMOS transistors P1 and P2, respectively, and connected to the power supply line (VDD) through contact holes (diffusion contacts) 4e and 4h, the first metal wirings and first via holes 6d and 6e, respectively.

A third metal wiring 8 is formed on second metal wirings 7a to 7g through a third interlayer insulating film which is not shown. Third metal wiring 8 becomes a word line (WL). Third metal wiring 8 is connected to second metal wirings 7a and 7g in the direction (lateral direction in FIG. 2), in which the P well regions and the N well region are aligned and which is perpendicular to the direction in which the respective well regions extend, through second via holes 9a and 9b.

Second metal wirings 7a and 7g are connected to polysilicon wirings (gate terminals) 3a and 3d through first via holes 6a and 6h, the first metal wirings and contact holes 4a and 4l, respectively. Therefore, polysilicon wirings 3a and 3d are electrically connected to third metal wiring (WL) 8.

Figure 3:
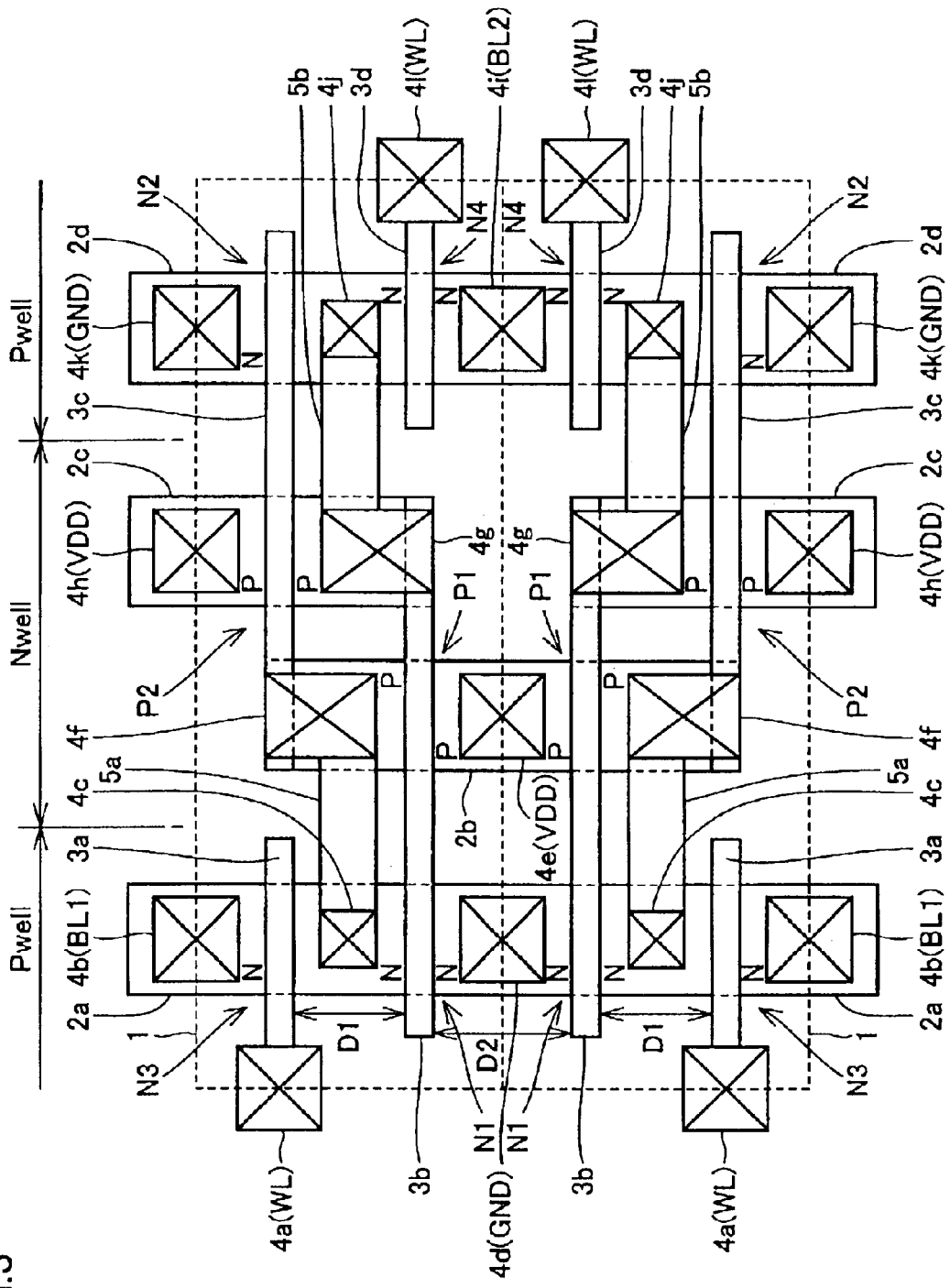
FIG. 3 shows a layout configuration of memory cells of two bits adjacent each other in an extension direction of bit lines.

FIG. 3 shows the layout configuration of memory cells 1 of two bits adjacent each other in the extension direction of bit lines. Lower memory cell 1 shown in FIG. 3 is obtained by arranging upper memory cell 1 to be inverted about the boundary line between upper and lower memory cells 1.

As shown in FIG. 3, distance D1 between polysilicon wirings 3a and 3b is set shorter than distance D2 between polysilicon wirings 3b of memory cells 1 adjacent each other in the extension direction of the bit lines. With this configuration, it is possible to reduce each memory cell in the short edge direction thereof, i.e., the extension direction of the bit lines (longitudinal direction in FIG. 1) and to thereby efficiently reduce the area of memory cell 1.

Even if distance D1 is set shorter as described above, it is necessary to secure a process margin for a mask deviation during the formation of polysilicon wirings 3a and 3b, contact hole 4c and the like. In other words, it is necessary to keep the distance between each of polysilicon wirings 3a and 3b and contact hole 4c to be not less than a certain value.

To this end, the size of contact hole 4c is reduced. Specifically, the length of each edge which specifies or defines contact hole 4c is shortened. As shown in FIGS. 1 and 3, the size of contact hole 4c is set smaller than that of each of adjacent contact holes 4b and 4d. With this configuration, it is possible to keep the distance between each of polysilicon wirings 3a and 3b and contact hole 4c to be not less than a certain value and to thereby secure a process margin.

As described above, if the size of contact hole 4c is reduced, the area of the contact between a conductor formed in contact hole 4c and the impurity diffused region is reduced and contact resistance, therefore, increases. However, since contact hole 4c is a contact section which forms the storage node, even the increase of contact resistance does not influence data read rate.

The reason is as follows. If contact resistances of contact hole 4c are R1 and R2, this means that resistances R1 and R2 are added between storage nodes Na and Nb and the drains of load PMOS transistors P1 and P2, respectively, as shown in FIG. 7.

A read operation for reading data from an SRAM memory cell is performed by amplifying the potential difference between bit lines BL1 and BL2 by a sense amplifier. At this time, charges are drawn from bit lines BL1 and BL2 using NMOS transistors N1 to N4, and resistances R1 and R2 do not, therefore, exist on a data read path. As a result, even if resistances R1 and R2 increase, the increase does not influence read rate.

In addition, since the length of each memory cell 1 in the extension direction of bit lines BL1 and BL2 is reduced, the lengths of bit lines BL1 and BL2 can be reduced, accordingly. As a result, the wiring capacitance and wiring resistance of each of bit lines BL1 and BL2 are reduced, making it possible to accelerate data read time and to reduce power consumption.

Moreover, by making the areas of the impurity diffused regions respectively forming the storage nodes small, the contact resistances increase and an RC time constant increases, making it possible to improve soft error resistance. The soft error means a phenomenon that information is destroyed by noise caused by electron-hole pairs which generates if α rays emitted from U and Th included in a package pass through the interior of a silicon substrate to thereby malfunction a memory.

Second Embodiment

Figure 4:
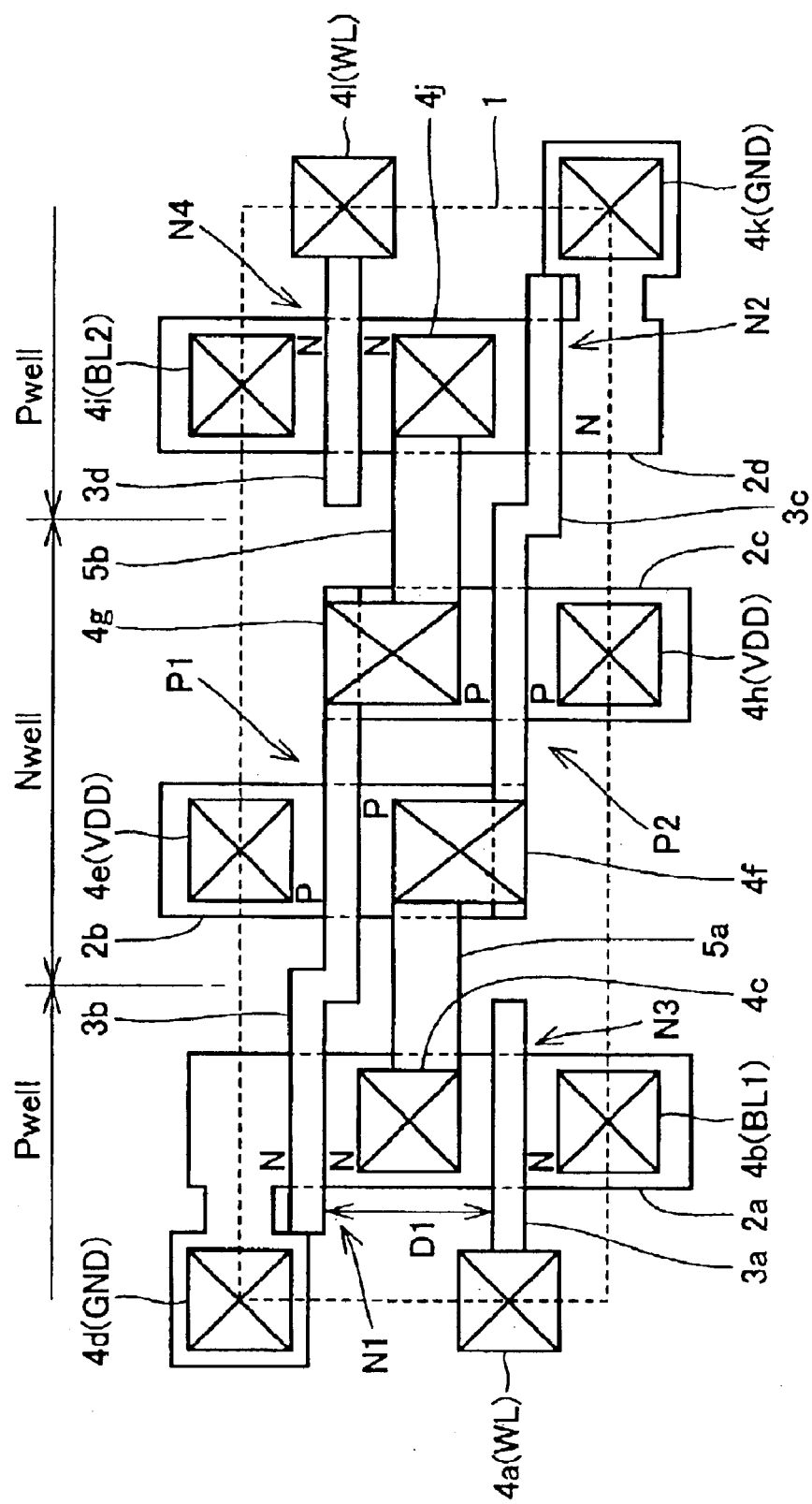
FIG. 4 shows a layout configuration of an SRAM memory cell according to a second embodiment of the present invention.
Figure 5:
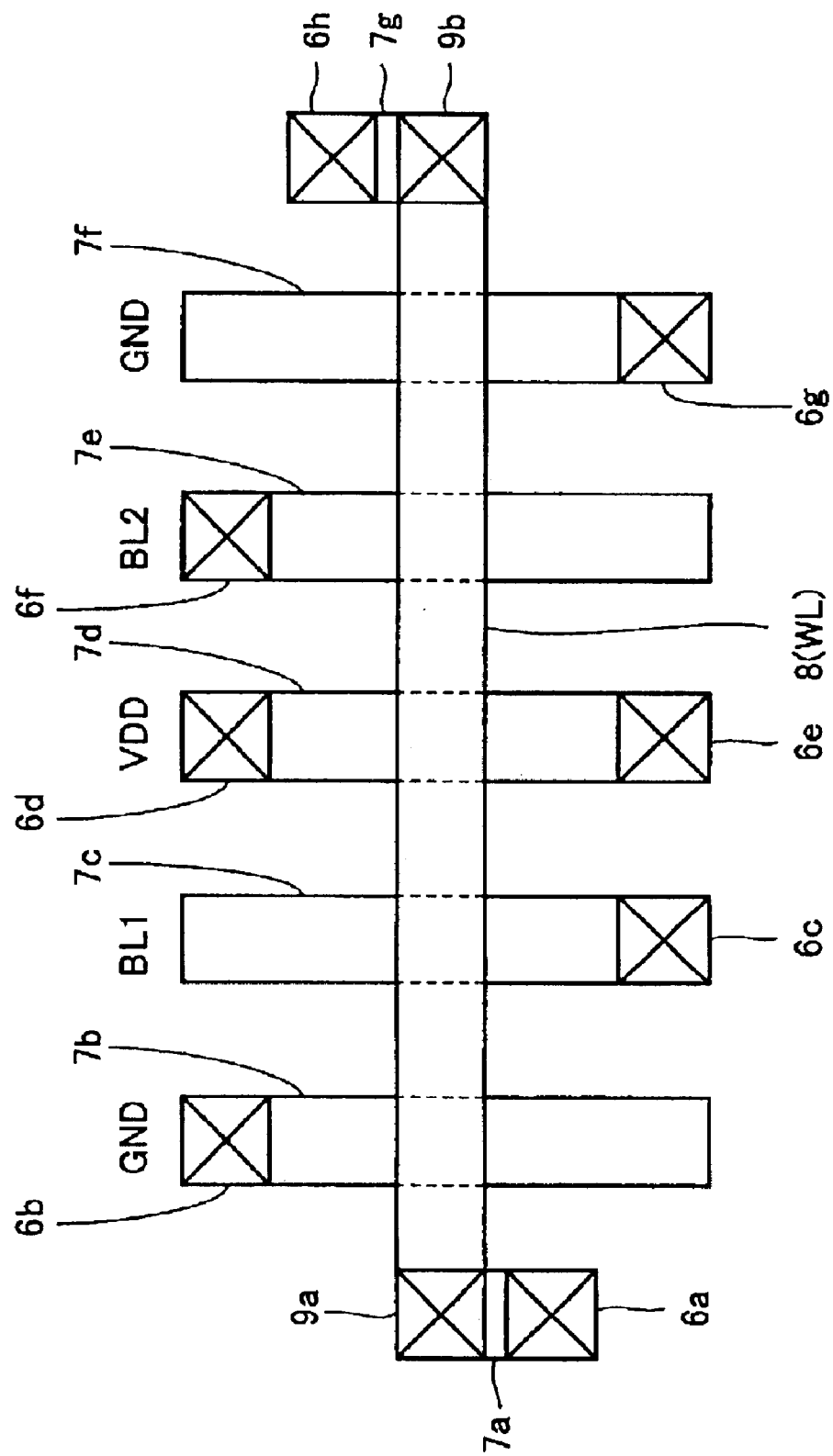
FIG. 5 shows a layout configuration of upper layer metal wirings of the memory cell shown in FIG. 4.

The second embodiment of the present invention will next be described with reference to FIGS. 4 to 6. FIGS. 4 and 5 are plan view of memory cell 1 of a full CMOS SRAM in a second embodiment. It is noted that FIG. 4 shows the layout of memory cell 1 up to the first metal wirings and that FIG. 5 shows the layout of second and third metal wirings.

Figure 6:
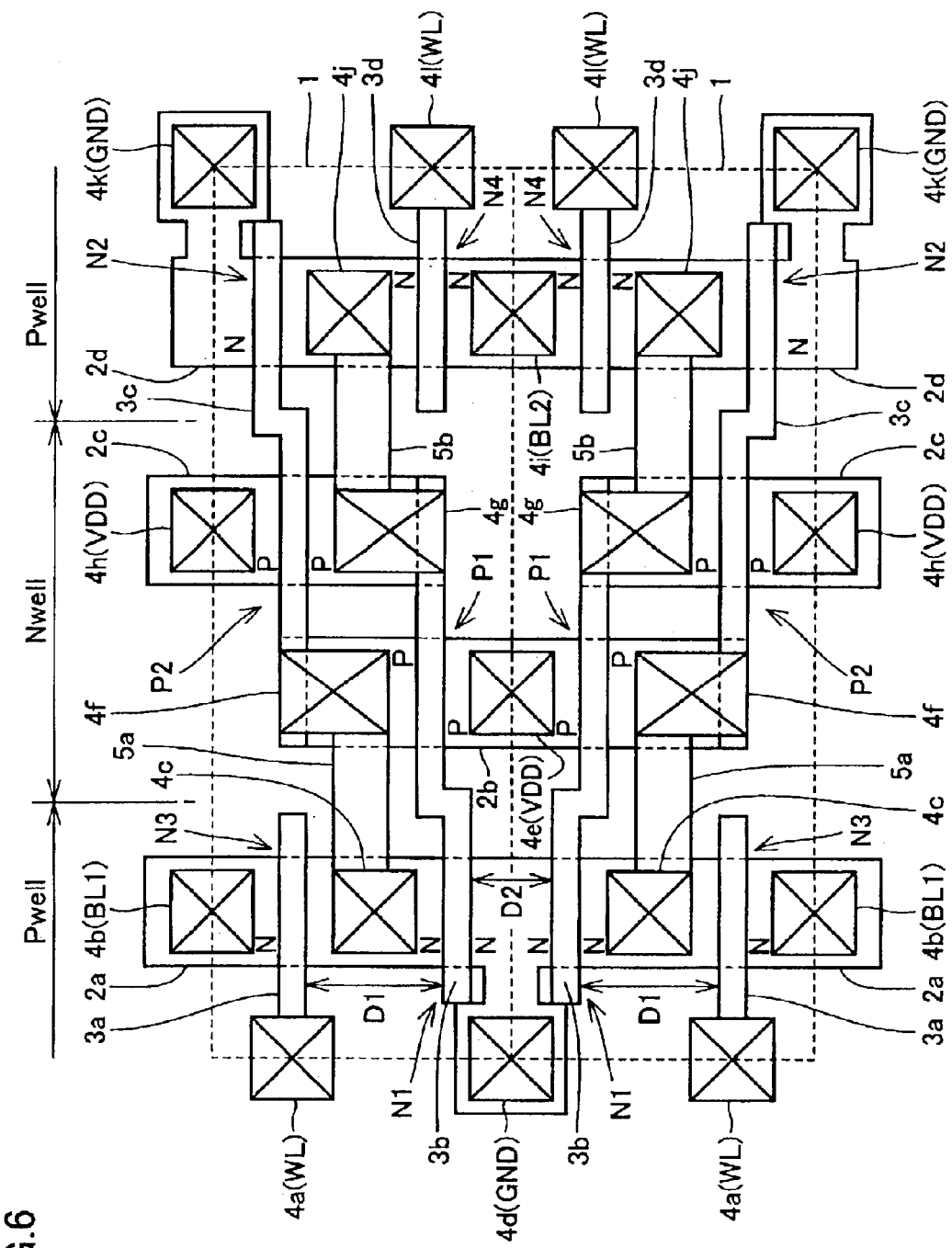
FIG. 6 shows a layout configuration of memory cells of two bits adjacent each other in an extension direction of bit lines.
Figure 7:
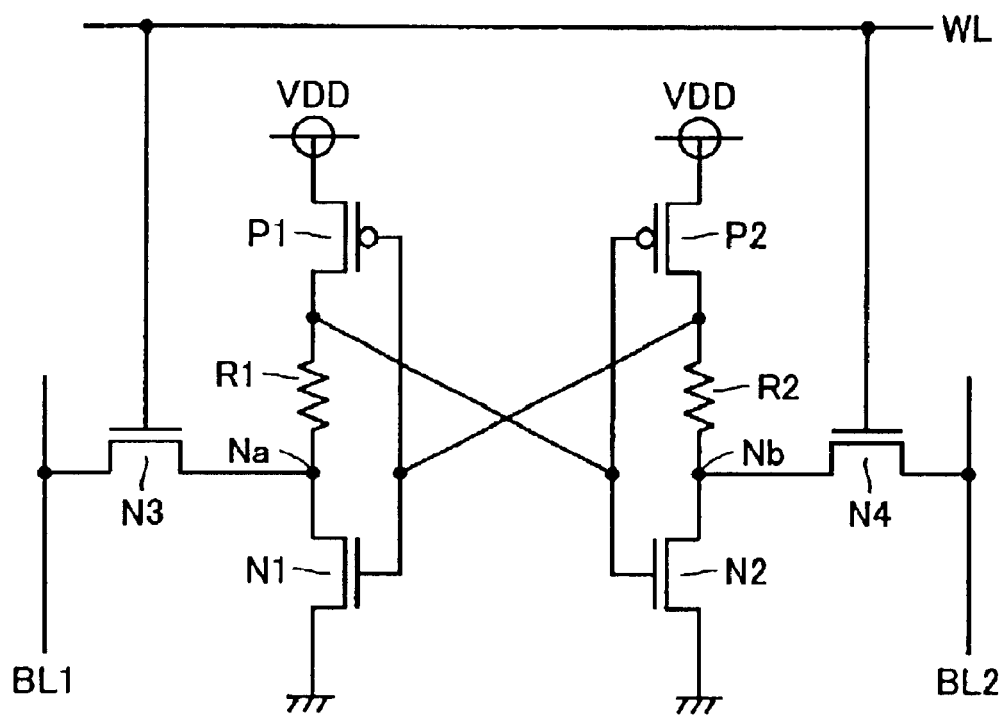
FIG. 7 is an equivalent circuit diagram of the SRAM memory cell according to the present invention.
Figure 8:
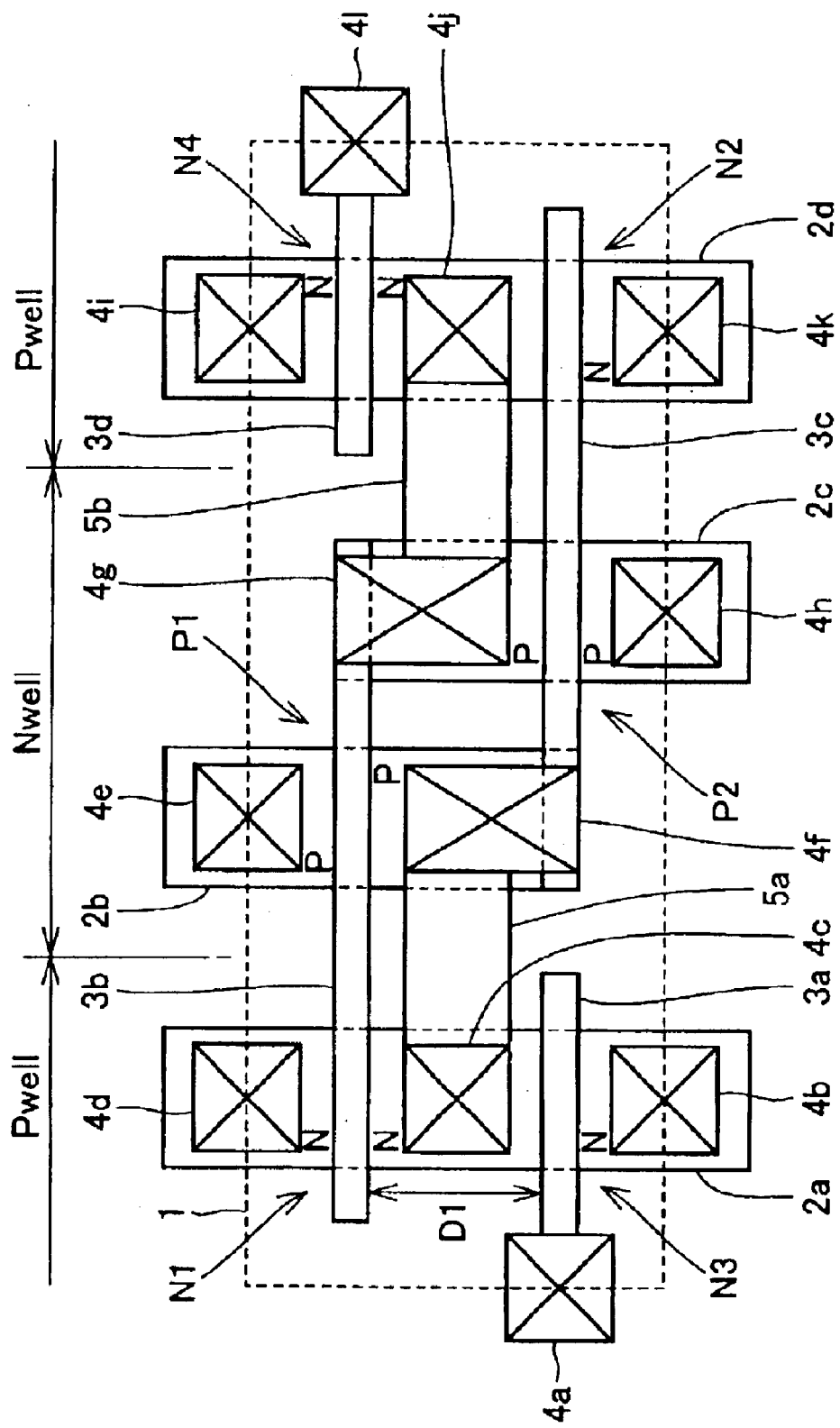
FIG. 8 shows a layout configuration of a conventional SRAM memory cell.
Figure 9:
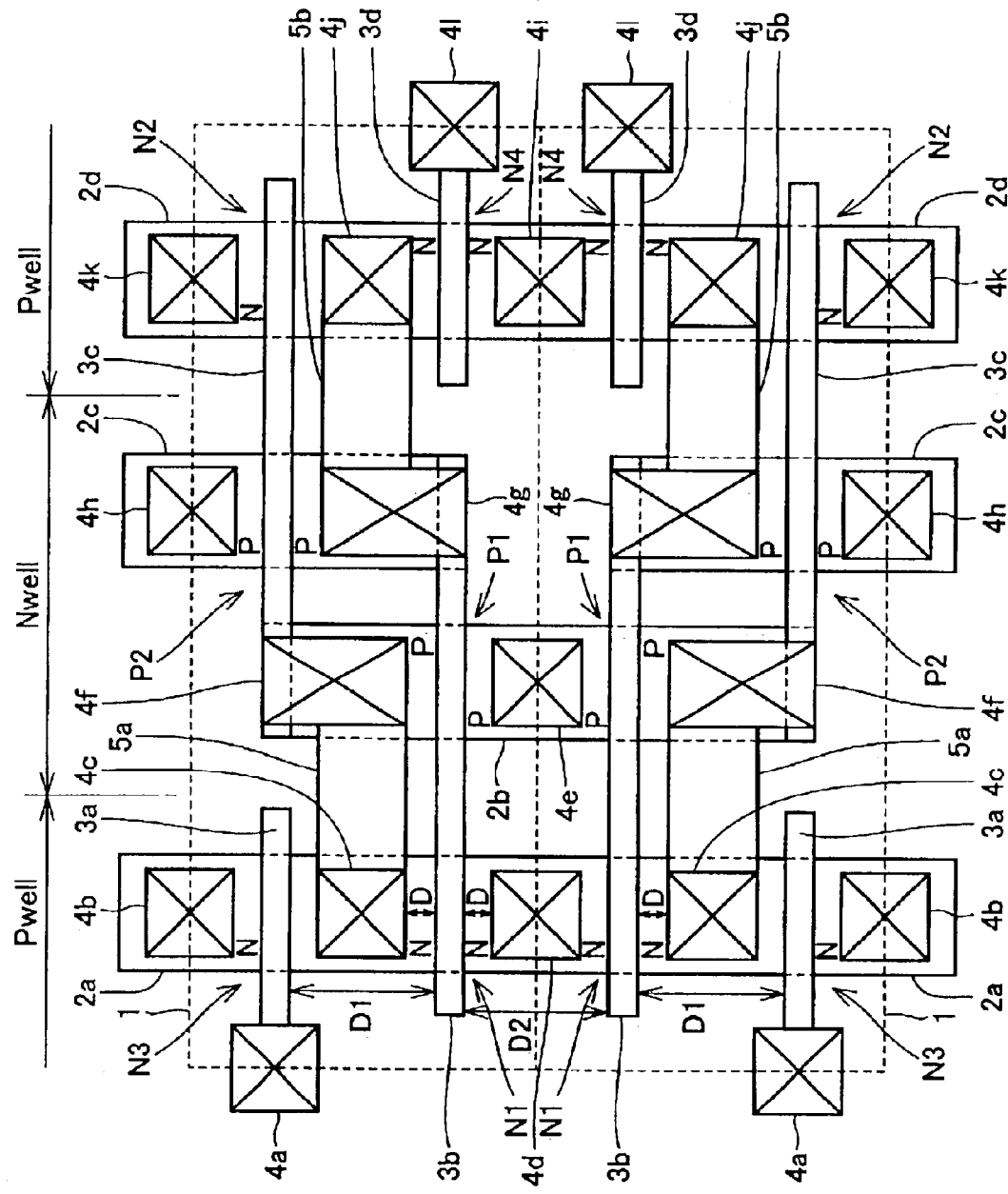
FIG. 9 shows a layout configuration of memory cells of two bits adjacent each other in an extension direction of bit lines.

FIG. 6 shows the layout configuration of memory cells 1 of two bits adjacent each other in the extension direction of bit lines. Lower memory cell 1 shown in FIG. 6 is obtained by arranging upper memory cell 1 to be inverted about the boundary line between upper and lower memory cells 1.

In the second embodiment, distance D1 between polysilicon wirings 3a and 3b is the same as that in the conventional art; however, unlike the conventional art, distance D2 between polysilicon wirings 3b of memory cells 1 adjacent each other in the extension direction of the bit lines is set smaller than distance D1. In this case, memory cell 1 can be reduced in the short edge direction thereof and the area of memory cell 1 can be thereby efficiently reduced.

As shown in FIGS. 4 and 6, in the second embodiment, the size of contact holes 4c and 4j which are the diffusion contact sections of storage node sections, respectively are equivalent to that in the conventional art. However, unlike the conventional art, contact holes 4d and 4k are provided in positions shifted from the region between polysilicon wirings 3b of adjacent memory cells 1 in the extension direction of word lines (lateral direction in FIGS. 4 and 6) so as to connect the ground lines (GND lines) to impurity diffused regions 2a and 2d, respectively.

By thus shifting the positions of contact holes 4d and 4k in the lateral direction, it becomes unnecessary to secure a wide region for forming contact holes 4d and 4k between polysilicon wirings 3b of adjacent memory cells 1, making it possible to make distance D2 shown in FIG. 6 shorter than distance D1.

In the embodiment shown in FIGS. 4 and 6, protrusion sections (bent sections or branch sections) are provided on impurity diffused regions 2a and 2d located on the boundary region between two memory cells 1, and the formation positions of contact holes 4d and 4k are shifted in the lateral direction (the extension direction of the word lines). More specifically, wide-width regions are provided on the tip ends of the bent sections or protrusion sections of impurity diffused regions 2a and 2d and contact holes 4d and 4k are formed on the wide-width regions, respectively.

Following the shifting of the formation positions of contact holes 4d and 4k in the lateral direction as described above, the shapes of polysilicon wirings 3b are slightly changed to be bent so that distance D2 between polysilicon wirings 3b opposed each other becomes short on impurity diffused regions 2a and 2d.

Further, as shown in FIG. 5, second metal wirings 7b and 7f are used as ground lines (GND lines), second metal wirings 7c and 7e are used as bit lines BL1 and BL2, respectively, and the formation positions of via holes 6b, 6c, 6f and 6g are changed. The other configuration is almost the same as that in the first embodiment. Accordingly, SRAM in the second embodiment can accelerate read time and reduce power consumption as in the case of the first embodiment.

The present invention have been described so far while referring to the embodiments thereof. However, it is initially contemplated to appropriately combine the features of these embodiments.

According to the present invention, the length of the shorter side of each memory cell can be shortened. Therefore, it is possible to efficiently reduce a memory cell area and to thereby obtain a semiconductor memory device which includes memory cells at high density. Further, since each memory cell can be reduced in the extension direction of the bit line, it is possible to shorten the length of the bit line. As a result, the wiring capacitance and wiring resistance of the bit line can be reduced, making it possible to accelerate data read time and to reduce power consumption.

If the size of the first contact section formed on the impurity diffused region located between the first and second gates is set smaller than that of the second contact section formed on the impurity diffused region located between the second and third gates, it is possible to make the distance between the first and second gates smaller than that between the second and third gates while securing a margin during manufacturing for contact holes and the like. In addition, if the first contact section is a contact section which is formed on the impurity diffused region which becomes a storage node and even if the contact resistance increases by decreasing the size of the contact section, it is possible to suppress the read rate from lowering. Besides, since it is possible to reduce the impurity diffused region which becomes the storage node section, it is possible to improve soft error resistance.

If a protrusion section protruding in the extension direction of the word line is provided in the impurity diffused region between the second and third gates and the second contact section is provided on the protrusion section of the impurity diffused region and formed at a position shifted from a region between the second and third gates in the extension direction of the word line, then it is possible to set the distance between the second and third gates smaller than that of the first and second gates.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a word line;

a bit line extending in a direction orthogonal to an extension direction of said word line;

first and second memory cells aligned in the extension direction of said bit line;

first and second gates of first and second MOS (Metal Oxide Semiconductor) transistors, respectively, formed in said first memory cell, extending in the extension direction of said word line and arranged to be away from each other in the extension direction of said bit line; and third and fourth gates of third and fourth MOS transistors, respectively, formed in said second memory cell, extending in the extension direction of said word line, and arranged to be away from each other in the extension direction of said bit line, wherein
said second and third MOS transistors are located in the vicinity of a boundary between said first and, second memory cells, and a distance between said first and second gates differs from a distance between said second and third gates.

2. The semiconductor memory device according to claim 1, wherein
the distance between said first and second gates is set shorter than the distance between said second and third gates.

3. The semiconductor memory device according to claim 2, further comprising:
an impurity diffused region extending in the extension direction of said bit line, and having said first, second, third and fourth gates extending thereon;
a first contact section formed on said impurity diffused region located between said first and second gates; and
a second contact section formed on said impurity diffused region located between said second and third gates, wherein
a size of said first contact section is set smaller than a size of said second contact section.

4. The semiconductor memory device according to claim 1, wherein
the distance between said second and third gates is set shorter than the distance between said first and second gates.

5. The semiconductor memory device according to claim 4, further comprising:
an impurity diffused region extending in the extension direction of said bit line, having said first, second, third and fourth gates extending thereon, and having a protrusion section protruding in the extension direction of said word line between said second and third gates;
a first contact section formed on said impurity diffused region located between said first and second gates; and
a second contact section provided on the protrusion section of said impurity diffused region, and formed at a position shifted from a region between said second and third gates in the extension direction of said word line.

6. A semiconductor memory device comprising:
a word line;
a bit line extending in a direction orthogonal to an extension direction of said word line;
first and second memory cells, having longitudinal direction and minor direction respectively, aligned in the extension direction of said bit line;
first and second gates of first and second MOS (Metal Oxide Semiconductor) transistors, respectively, formed in said first memory cell, extending in the extension direction of said word line and arranged to be away from each other in the extension direction of said bit line; and
third and fourth gates of third and fourth MOS transistors, respectively, formed in said second memory cell, extending in the extension direction of said word line, and arranged to be away from each other in the extension direction of said bit line, wherein
said word line and said first through fourth gates extend in said longitudinal direction of said first and second memory cells,
said second and third MOS transistors are located in the vicinity of a boundary between said first and second memory cells, and a distance between said first and second gates in said minor direction of said first and second memory cells differs from a distance between said second and third gates in said minor direction of said first and second memory cells.

* * * * *